United States Patent
Cabral, Jr. et al.

(10) Patent No.: US 7,749,847 B2
(45) Date of Patent: Jul. 6, 2010

(54) CMOS INTEGRATION SCHEME EMPLOYING A SILICIDE ELECTRODE AND A SILICIDE-GERMANIDE ALLOY ELECTRODE

(75) Inventors: Cyril Cabral, Jr., Mahopac, NY (US); Jack O. Chu, Manhasset Hills, NY (US); Young-Hee Kim, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 12/031,224

(22) Filed: Feb. 14, 2008

(65) Prior Publication Data

US 2009/0206413 A1    Aug. 20, 2009

(51) Int. Cl.
*H01L 21/8238* (2006.01)
*H01L 27/092* (2006.01)
(52) U.S. Cl. ............... 438/285; 257/369; 257/E21.634; 257/E27.062; 257/E29.156; 438/933; 438/199
(58) Field of Classification Search ................. 257/369, 257/616, 742, E21.634, E27.062, E29.156, 257/E29.161, E23.157, E21.13, E21.296; 438/285, 933, 630, 199, 721
See application file for complete search history.

(56) References Cited

U.S. PATENT DOCUMENTS

| | | | |
|---|---|---|---|
| 7,018,883 B2 | 3/2006 | Wang et al. | |
| 7,183,613 B1 | 2/2007 | Zhu et al. | |
| 2003/0207555 A1 | 11/2003 | Takayanagi et al. | |
| 2005/0269635 A1 | 12/2005 | Bojarczuk, Jr. et al. | |
| 2006/0011984 A1 | 1/2006 | Currie | |
| 2006/0014366 A1 | 1/2006 | Currie | |
| 2006/0121663 A1 | 6/2006 | Fang et al. | |
| 2006/0163670 A1 | 7/2006 | Ellis-Monaghan et al. | |
| 2006/0170047 A1* | 8/2006 | Ishimaru | 257/347 |
| 2007/0020865 A1 | 1/2007 | Chen et al. | |
| 2007/0023849 A1 | 2/2007 | Yu et al. | |
| 2007/0034948 A1 | 2/2007 | Cacho et al. | |
| 2009/0085062 A1* | 4/2009 | Jin et al. | 257/190 |

FOREIGN PATENT DOCUMENTS

EP    1 538 674 A3    6/2005

* cited by examiner

*Primary Examiner*—Victor A Mandala
*Assistant Examiner*—Whitney Moore
(74) *Attorney, Agent, or Firm*—Scully, Scott, Murphy & Presser, P.C.; Louis J. Percello, Esq.

(57) ABSTRACT

A p-type field effect transistor (PFET) and an n-type field effect transistor (NFET) are formed by patterning of a gate dielectric layer, a thin silicon layer, and a silicon-germanium alloy layer. After formation of the source/drain regions and gate spacers, silicon germanium alloy portions are removed from gate stacks. A dielectric layer is formed and patterned to cover an NFET gate electrode, while exposing a thin silicon portion for a PFET. Germanium is selectively deposited on semiconductor surfaces including the exposed silicon portion. The dielectric layer is removed and a metal layer is deposited and reacted with underlying semiconductor material to form a metal silicide for a gate electrode of the NFET, while forming a metal silicide-germanide alloy for a gate electrode of the PFET.

25 Claims, 10 Drawing Sheets

CMOS INTEGRATION SCHEME EMPLOYING A SILICIDE ELECTRODE AND A SILICIDE-GERMANIDE ALLOY ELECTRODE

FIELD OF THE INVENTION

The present invention relates to a semiconductor structure, and more particularly to a complementary metal oxide semiconductor (CMOS) transistor having a metal silicide electrode and a metal silicide-germanide alloy electrode, and methods of manufacturing the same.

BACKGROUND OF THE INVENTION

A field effect transistor having a metal gate electrode has enhanced performance over a comparable field effect transistor having a polysilicon electrode due to higher conductivity of the gate electrode, and consequently, a reduced signal delay in the operation of the transistor. Further, the polysilicon depletion effect is eliminated by the metal gate electrode, which allows the gate dielectric to be electrically thinner. In addition, boron dopant diffusion into the channel region is eliminated in the case of p-type field effect transistors. While such benefits of the metal gate electrode are known in the art, integration of metal gate electrodes has proven to be difficult to implement in a conventional process flow for complementary metal oxide semiconductor (CMOS) transistors.

Specifically, most metal gate materials interact with a gate dielectric during the high temperature processing steps required for source/drain (S/D) junction activation anneals. The need to keep the metal gate stack from receiving high temperature anneals has lead to the development of the "gate last" or "replacement gate" integration schemes, in which a gate stack is fabricated after source/drain activation and metallization of the source and the drain, and maintained at temperatures below 500° C. during subsequent processing.

The difficulty of integrating metal gate electrodes into a semiconductor structure employing CMOS transistors is further increased because integration of CMOS transistors requires two gate materials, one having a work function near the valence band edge of the semiconductor material in the channel and the other having a work function near the conduction band edge of the same semiconductor material. For example, in CMOS devices having a silicon channel, a conductive material having a work function of about 4.0 eV is necessary for n-type metal oxide semiconductor field effect transistors (NMOSFETs) and another conductive material having a work function of about 5.0 eV is necessary for p-type metal oxide semiconductor field effect transistors (PMOSFETs).

Replacement gate integration schemes known in the prior art typically require formation of the gate dielectric after a source/drain activation anneal. Exposure of a semiconductor surface by etching prior to formation of gate dielectrics, which typically comprise a high-k dielectric material, often leads to interfacial defects between a channel and the gate dielectric. Further, two different metal gate materials are typically formed with accompanying lithographic patterning steps and planarization steps. Many prior art replacement gate integration schemes require two separate steps for formation of gate dielectrics. Thus, while replacement gate integration schemes known in the prior art increase the choice of materials for a metal gate electrode, increases in the processing complexity and cost is substantial over typical conventional CMOS process flows.

In view of the above, there exists a need for a semiconductor structure that provides functional advantages of CMOS transistors with metal gate electrodes including dual work function, while avoiding damages and interfacial states between gate dielectrics and channels.

Further, there exists a need for methods of manufacturing such a semiconductor structure while minimizing any increase in processing complexity and cost over conventional CMOS integration schemes.

SUMMARY OF THE INVENTION

To address the needs described above, the present invention provides a semiconductor structure including a transistor having a metal silicide electrode and another transistor having a metal silicide-germanide alloy electrode, and methods of manufacturing the same.

In the present invention, a p-type field effect transistor (PFET) and an a-type field effect transistor (NFET) are formed by patterning of a gate dielectric layer, a thin silicon layer, and a silicon-germanium alloy layer. After formation of the source/drain regions and gate spacers, silicon germanium alloy portions are removed from gate stacks. A dielectric layer is formed and patterned to cover an NFET gate electrode, while exposing a thin silicon portion for a PFET. Germanium is selectively deposited on semiconductor surfaces including the exposed silicon portion. The dielectric layer is removed and a metal layer is deposited and reacted with underlying semiconductor material to form a metal silicide for a gate electrode of the NFET, while forming a metal silicide-germanide alloy for a gate electrode of the PFET.

In order to reduce processing complexity and cost, a self-aligned metal gate processing scheme employing a sacrificial layer is disclosed. The sacrificial layer comprises a germanium-containing layer. This processing flow allows for high temperature processing for source and drain activation anneals without concern for reaction between a high-k-gate dielectric and a metal gate material. Self-aligned silicide portions, including a filly silicided metal silicide gate electrode, are formed on one type of transistor, which is typically an n-type field effect transistor, while self-aligned metal silicide-germanide alloy portions, including a fully metallized silicide-germanide alloy gate electrode, are formed on another type of transistor. The present invention avoids full implementation of replacement gate processing steps so that the interface between a channel region and a gate dielectric is protected. In addition, an additional advantage of self-aligned metal gate structures is provided. Despite deposition of only one metal layer for metallization, different metallized materials may be formed between p-type and n-type field effect transistors. Further, since hydrogen diffuses through the silicide and silicide-germanide alloys, passivation of complementary metal oxide semiconductor devices may easily be accomplished.

According to an aspect of the present invention, a method of forming a semiconductor structure is provided, which comprises:

forming a first gate dielectric on a first semiconductor portion of a semiconductor substrate and a second gate dielectric on a second semiconductor portion of the semiconductor substrate;

forming a first silicon portion on the first gate dielectric and a second silicon portion on the second gate dielectric;

forming a gate side germanium-containing portion on the second silicon portion, while no germanium is deposited on the first silicon portion; and forming a first gate electrode comprising a metal silicide directly on the first gate dielectric and forming a second gate electrode comprising a metal silicide-germanide alloy directly on the second gate dielectric.

In one embodiment, the method further comprises forming a first disposable germanium-containing portion on the first silicon portion and a second disposable germanium-containing portion on the second silicon portion, wherein the first and second disposable germanium-containing portions comprise germanium at an atomic concentration of about 25% to 100%. Preferably, the atomic concentration of the first and second disposable germanium-containing portions may be from about 50% to 100%.

In another embodiment, the first and second disposable germanium-containing portions comprise germanium or a silicon germanium alloy having a same germanium concentration.

In even another embodiment, the method further comprises forming a first gate spacer on sidewalls of the first silicon portion and the first disposable germanium-containing portion and a second gate spacer on sidewalls of the second silicon portion and the second disposable germanium-containing portion.

In yet another embodiment, the method further comprises removing the first and second disposable germanium-containing portions selective to the first and second silicon portions.

In still another embodiment, the method further comprises forming a dielectric masking layer directly on the first and second silicon portions after the removing of the first and second disposable germanium-containing portions.

In still yet another embodiment, the method further comprises patterning the dielectric masking layer, wherein the first silicon portion is covered by the dielectric masking layer after the patterning, and wherein the second silicon portion is exposed after the patterning.

In a further embodiment, the gate side germanium-containing portion comprises germanium or a silicon germanium alloy. An atomic concentration of germanium in the gate side germanium-containing portion may be from about 5% to 100%. The atomic concentration of germanium may be substantially uniform throughout the gate side germanium-containing portion as deposited.

In an even further embodiment, a selective germanium-containing material deposition process is employed to form the gate side germanium-containing portion, wherein germanium or the silicon germanium alloy is deposited on semiconductor surfaces and is not deposited on dielectric surfaces during the selective germanium-containing material deposition process.

In a yet further embodiment, the method further comprises:
depositing a metal layer directly on the first silicon portion and the gate side germanium-containing portion; and
metallizing the first silicon portion and a stack of the gate side germanium-containing portion and the second silicon portion.

In a still further embodiment, a first gate electrode comprising a metal silicide is formed directly on the first gate dielectric and a second gate electrode comprising a metal silicide-germanide alloy is formed directly on the second gate dielectric.

In still yet further embodiment, the first gate electrode has a composition of MSi at an interface with the first gate dielectric and the second gate electrode has a composition of $MGe_xSi_{1-x}$ at an interface with the second gate dielectric, wherein x is from about 0.05 to about 0.85, and M is an elemental metal or a metal alloy having a composition of $A_yB_{1-y}$, wherein y is from 0 to 1, and A is a first elemental metal and B is a second elemental metal.

In further another embodiment, the method further comprises:
forming a first gate spacer on the first silicon portion and a second gate spacer on the second silicon portion; and
forming a first source region and a first drain region in the first semiconductor portion and a second source region and a second drain region in the second semiconductor portion.

In even further another embodiment, the first source region and the first drain region are covered by the dielectric masking layer after the patterning, and the second source region and the second drain region are exposed after the patterning.

In yet further another embodiment, the method further comprises:
forming a gate side germanium-containing portion directly on the second silicon portion;
forming a source side germanium-containing portion directly on the second source region; and
forming a drain side germanium-containing portion directly on the second drain region, wherein deposition of germanium or a germanium-containing alloy does not occur directly on the first silicon portion, the first source region, and the first drain region.

In still further another embodiment, the method further comprises:
forming a gate dielectric layer directly on the semiconductor substrate;
forming a silicon layer comprising amorphous silicon or polysilicon directly on the gate dielectric layer;
forming a germanium-containing layer comprising germanium at an atomic concentration of about 25% or greater directly on the silicon layer; and
patterning the germanium-containing layer and the silicon layer, wherein the first silicon portion and the second silicon portion are formed from the silicon layer, and wherein a first disposable germanium-containing portion is formed on the first silicon portion and a second disposable germanium-containing portion is formed on the second silicon portion.

According to another aspect of the present invention, a semiconductor structure is provided, which comprises:
a first field effect transistor having a first gate dielectric and a first gate electrode located directly on the first gate dielectric, wherein the first gate electrode comprises a metal silicide and has a first thickness; and
a second field effect transistor having a second gate dielectric and a second gate electrode located directly on the second gate dielectric, wherein the second gate electrode comprises a metal silicide-germanide alloy and has a second thickness, wherein the second thickness is greater than the first thickness.

In one embodiment, the semiconductor structure further comprises:
a source side metal silicide portion located directly on a source region of the first field effect transistor and comprising the metal silicide and having a third thickness;
a drain side metal silicide portion located directly on a drain region of the first field effect transistor and comprising the metal silicide and having the third thickness;
a source side metal silicide-germanide alloy portion located directly on a source region of the second field effect transistor and comprising the metal silicide-germanide alloy and having a fourth thickness; and
a drain side metal silicide-germanide alloy portion located directly on a drain region of the second field effect transistor and comprising the metal silicide-germanide alloy and having the fourth thickness, wherein the fourth thickness is greater than the third thickness.

In another embodiment, the metal silicide and the metal silicide-germanide alloy are derived from a metal that forms a metal monosilicide and a metal monogermanide. For example, the metal layer may comprise nickel, platinum, palladium, cobalt, or a combination thereof.

In even another embodiment, a ratio of the second thickness to the first thickness is from 1.0 to about 1.30. The ratio of the second thickness to the first thickness may be from about 1.1 to about 1.30.

In yet another embodiment, the semiconductor structure further comprises:

a first gate spacer laterally abutting the first gate electrode;

a second gate spacer laterally abutting the second gate electrode; and a middle-of-the-line (MOL) dielectric layer vertically abutting a top surface of the first gate electrode, a top surface of the second gate electrode, inner sidewalls of the first gate spacer, and inner sidewalls of the second gate spacer.

In still another embodiment, the first gate electrode has a composition of MSi at an interface with the first gate dielectric and the second gate electrode has a composition of $MGe_xSi_{1-x}$ at an interface with the second gate dielectric, wherein x is from about 0.05 to about 0.85, and M is an elemental metal or a metal alloy having a composition of $A_yB_{1-y}$, wherein y is from 0 to 1, and A is a first elemental metal and B is a second elemental metal.

The second gate electrode may have a vertically graded composition, wherein the x increases with distance from the second gate dielectric. Alternately, the x may be substantially constant throughout the second gate electrode.

In still yet another embodiment, a total amount of silicon per unit area within the first gate electrode is substantially the same as a total amount of silicon per unit area within the second gate electrode.

In a further embodiment, the first field effect transistor is an n-type field effect transistor and the second field effect transistor is a p-type field effect transistor.

DETAILED DESCRIPTION OF THE INVENTION

Figure 1:
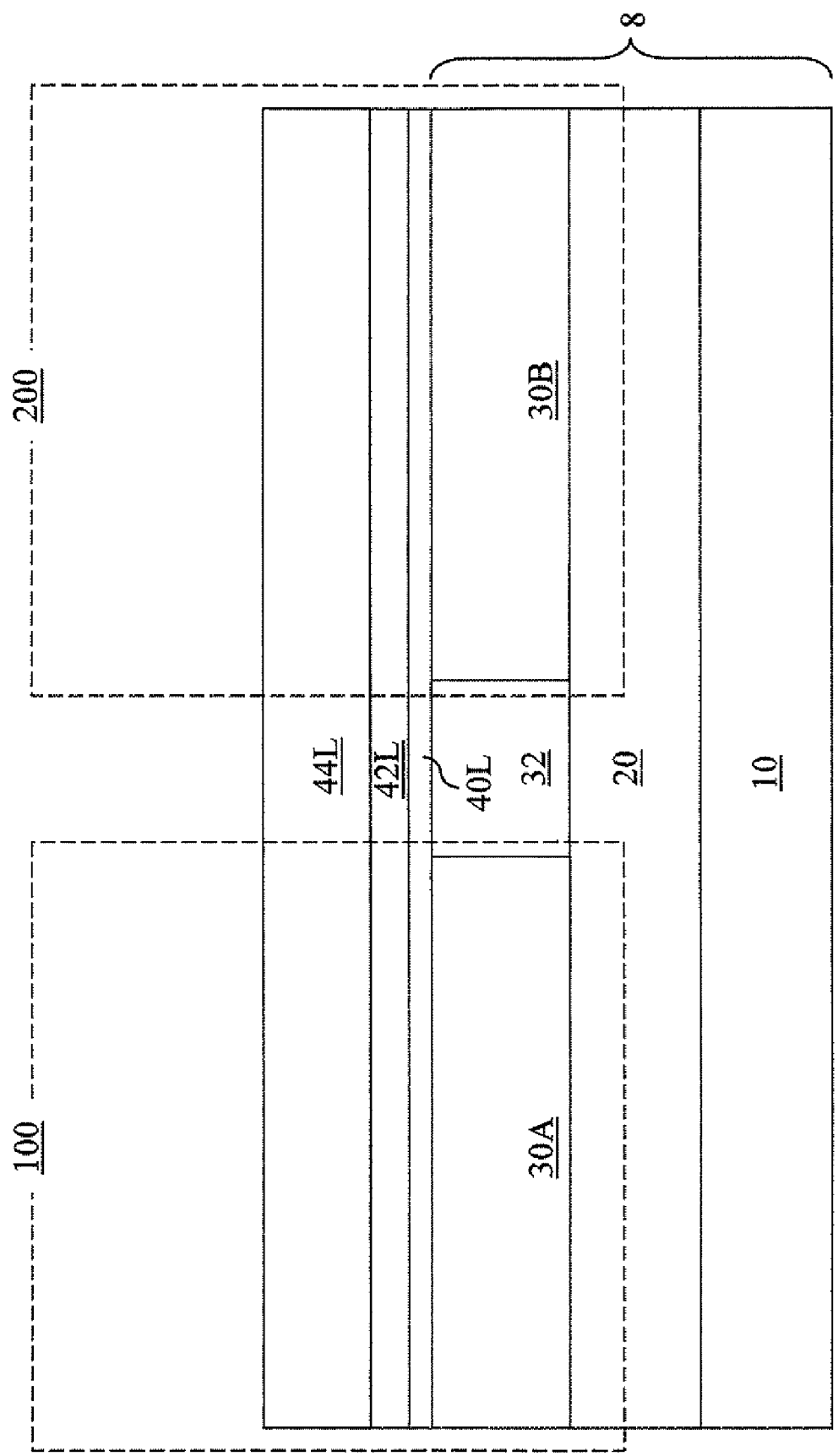
FIGS. 1-10 are sequential vertical cross-sectional views of an exemplary semiconductor structure according to the present invention.

As stated above, the present invention relates to a complementary metal oxide semiconductor (CMOS) transistor having a metal silicide electrode and a metal silicide-germanide alloy electrode, and methods of manufacturing the same, which are now described in detail with accompanying figures. It is noted that like and corresponding elements are referred to by like reference numerals.

Referring to FIG. 1, an exemplary semiconductor structure according to the present invention comprises a semiconductor substrate 8 containing a handle substrate 10, a buried insulator layer 20, and a top semiconductor layer including a first semiconductor portion 30A, a second semiconductor portion 30B, and a shallow trench isolation structure 32. The first semiconductor portion 30A and the second semiconductor portion 30B comprise a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may comprise silicon. The present invention is described for the case of the first and second semiconductor portions (30A, 30B) comprising silicon, although embodiments in which the first and second semiconductor portions (30A, 30B) comprise another semiconductor material and metal semiconductor alloys comprising that material and a metal directly on the first and second semiconductor portions (30A, 30B) are explicitly contemplated herein.

Preferably, each of the first and second semiconductor portions (30A, 30B) is single crystalline. The semiconductor substrate 8 may be a bulk substrate, a semiconductor-on-insulator (SOI) substrate, or a hybrid substrate in which a first semiconductor portion 30A and a second semiconductor portion 30B are separated by a shallow trench isolation structure 20. The first and/or second semiconductor portions may have a built-in stress for enhancing mobility of charge carriers. While the present invention is described with a semiconductor-on-insulator (SOI) substrate, implementation of the present invention on a bulk substrate or on a hybrid substrate is explicitly contemplated herein.

The handle substrate 8 may comprise a semiconductor material such as silicon, a dielectric material such as quartz, glass, sapphire etc., or a metallic material such as an elemental metal or a metallic alloy. The buried insulator layer 20 comprises an insulating material having a lower dielectric constant than the dielectric constant of the semiconductor material in the first and second semiconductor portions (30A, 30B). The buried insulator layer 20 may comprise silicon oxide or silicon nitride.

The first semiconductor portion 30A and/or the second semiconductor portion 30B may be doped with electrical dopants such as B, Ga, In, P, As, Sb, or a combination thereof. In case both the first and second semiconductor portions (30A, 30B) are doped, the first and second semiconductor portions (30A, 30B) may have the same type of doping, or an opposite type of doping. The present invention is described assuming that the first semiconductor portion 30A has a p-type doping and the second semiconductor portion 30B has an n-type doping. However, embodiments in which the first semiconductor portion 30A has an n-type doping and the second semiconductor portion 30B has a p-type doping or at least one of the first and second semiconductor portions (30A, 30B) is substantially intrinsic are contemplated herein explicitly. In case the first and/or second semiconductor portions (30A, 30B) are doped, the dopant concentration of the first and/or second semiconductor portions (30A, 30B) may be from about $1.0 \times 10^{14}/cm^3$ to about $1.0 \times 10^{19}/cm^3$, and preferably from about $1.0 \times 10^{15}/cm^3$ to about $1.0 \times 10^{18}/cm^3$, although lesser and greater dopant concentrations are explicitly contemplated herein.

A gate dielectric layer 40L is formed directly on a top surface of the first semiconductor portion 30A and a top surface of the second semiconductor portion 30B. The gate dielectric layer 40L may comprise a silicon oxide based dielectric layer such as silicon oxide ($SiO_2$), silicon oxynitride ($SiO_xN_y$), or a combination thereof. The value of x in $SiO_xN_y$ may be from 0 to about 2, and the value of y in $SiO_xN_y$ may be from 0 to about 4/3. Alternately, the gate dielectric layer 40L may comprise a dielectric metal oxide material known as high-k gate dielectric materials. Non-limiting examples of the dielectric meal oxide material include $HfO_2$, $ZrO_2$, $Al_2O_3$, $La_2O_3$, $Y_2O_3$, $TiO_2$, $SrTiO_3$, $LaAlO_3$, $Y_2O_3$, silicates thereof, alloys thereof, and non-stoichiometric variants thereof. The gate dielectric layer 40L may have a thickness from about 0.8 nm to about 20 nm, and may have an effective oxide thickness (EOT) from about 0.8 nm to about 10 nm.

A silicon layer 42L is formed on the gate dielectric layer 40L by methods known in the art including low pressure chemical vapor deposition (LPCVD), rapid thermal chemical vapor deposition (RTCVD), plasma enhanced chemical vapor deposition (PECVD), physical vapor deposition (PVD), etc. The silicon layer 42L comprises silicon, and may, or may not, contain electrical dopants such as B, Ga, In, P, As, Sb, or a combination thereof. The silicon layer 42L may be amorphous, polycrystalline, or microcrystalline. The thickness of the silicon layer 42L may be from about 5 nm to about 40 nm, and typically from about 10 nm to about 25 nm, although lesser and greater thicknesses are explicitly contemplated herein.

A germanium-containing layer 44L is formed on the silicon layer 42 by methods known in the art including the various chemical vapor deposition (CVD) methods above and physical vapor deposition (PVD). The germanium-containing layer 44L contains germanium at an atomic concentration from about 25% to 100%, and preferably from about 50% to 100%. The germanium-containing layer 44L may be amorphous, polycrystalline, or microcrystalline. The thickness of the germanium-containing layer 44L may be from about 1 nm to about 160 nm, and typically from about 5 nm to about 100 nm, although lesser and greater thicknesses are explicitly contemplated herein.

The exemplary semiconductor structure comprises a first device region 100 and a second device region 200. The first device region 100 contains the first semiconductor portion 30A and other elements present or to be formed within and above the first semiconductor portion 30A. The second device region 200 contains the second semiconductor portion 30B and other elements present or to be formed within and above the second semiconductor portion 30B. In the present invention, an n-type metal-oxide-semiconductor field effect transistor (NMOSFET, or NFET) is subsequently formed in the first device region 100, and a p-type metal-oxide-semiconductor field effect transistor (PMOSFET, or PFET) is subsequently formed in the second device region 200.

Figure 2:
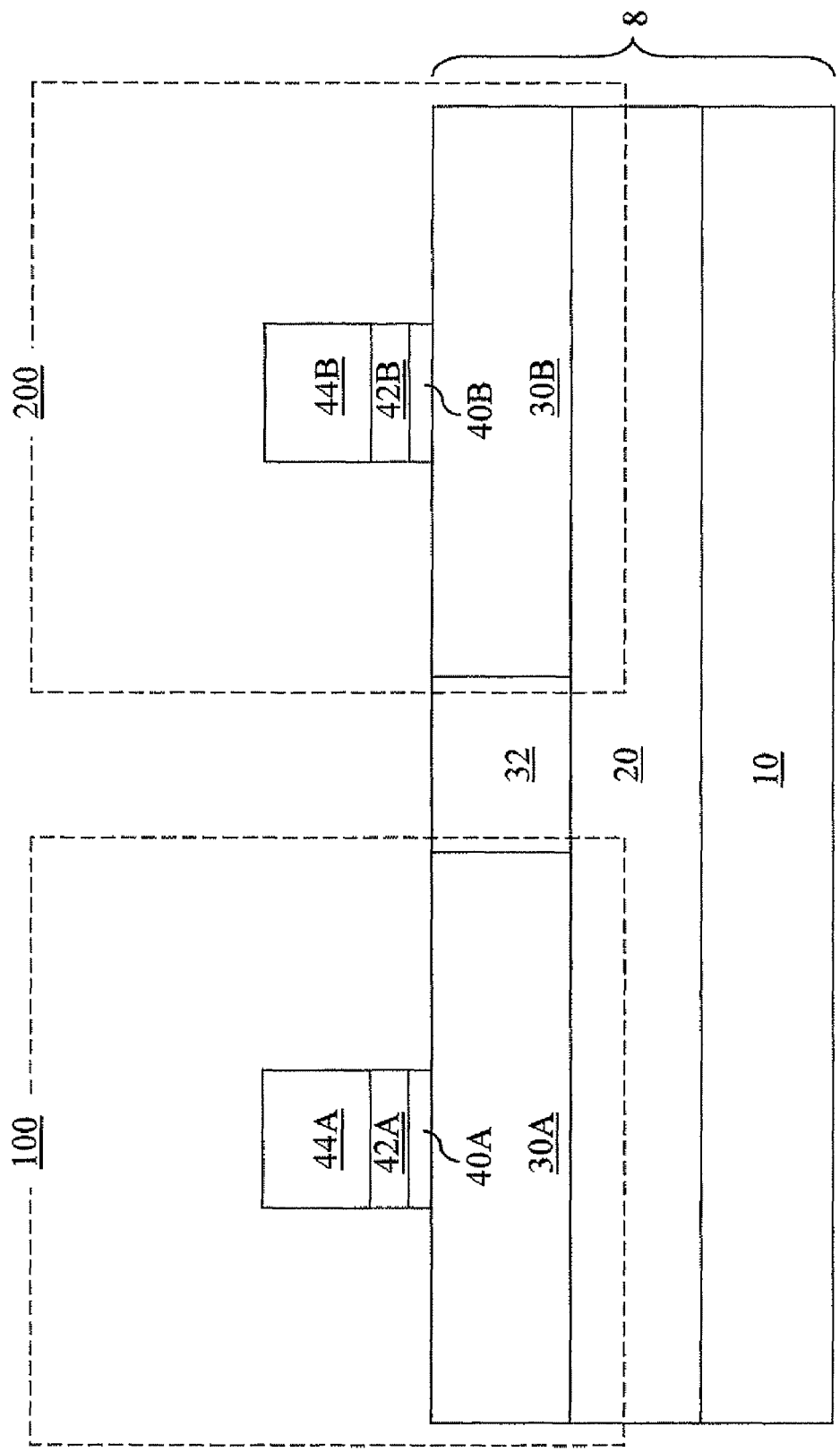

Referring FIG. 2, the germanium-containing layer 44L, the silicon layer 42L, and the gate dielectric layer 40L are lithographically patterned to form a first stack of a first gate dielectric 40A, a first silicon portion 42A, a first disposable germanium-containing portion 44A in the first device region 100, and a second stack of a second gate dielectric 40B, a second silicon portion 42B, and a second disposable germanium-containing portion 44B in the second device region 200. For example, a photoresist (not shown) may be applied over a top surface of the germanium-containing layer 44L, exposed, and developed to form a lithographic pattern with the remaining portions of the photoresist. The pattern is subsequently transferred into the stack of the germanium-containing layer 44L, the silicon layer 42L, and the gate dielectric layer 40L by an anisotropic etch such as a reactive ion etch. Etch chemistry within an isotropic etch processing step may be altered as need during the etch of the three different layers (44L, 42L, 40L). The etch chemistry employed during etching of the gate dielectric layer 40L is preferably selective to the semiconductor material of the first and second semiconductor portions (30A, 30B). The height of each portion (40A, 40B, 42A, 42B, 44A, or 44B) is substantially the same as the thickness of the layer (40L, 42L, or 44L) out of which that portion is formed. The first disposable germanium-containing portion 44A and the second disposable germanium-containing portion 44B are "disposable" since they are removed in subsequent processing steps.

Figure 3:
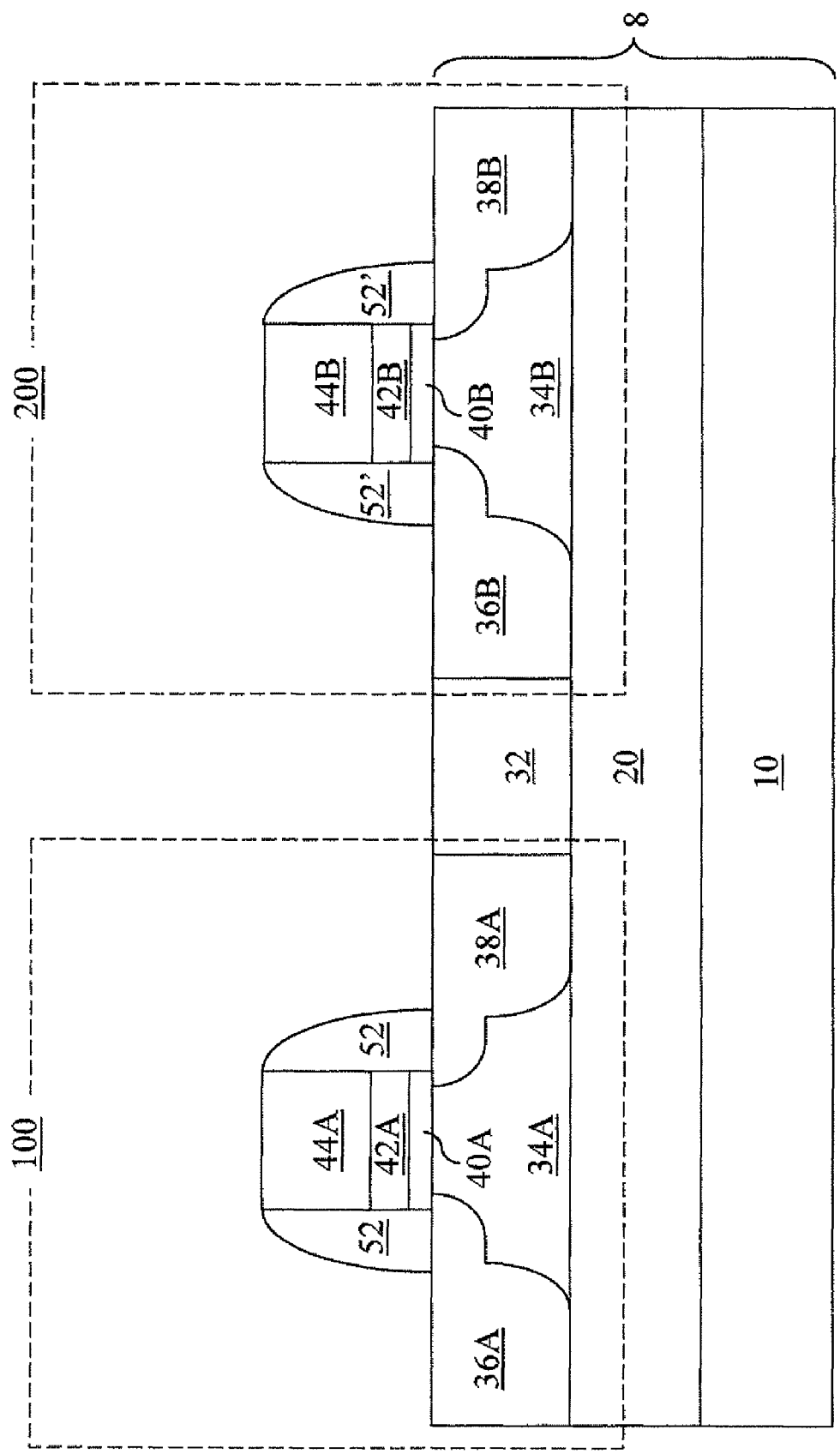

Referring to FIG. 3, source and drain regions and gate spacers are formed in the exemplary semiconductor structure. Specifically, n-type dopants are implanted into portions of the first semiconductor portion 30A, which has a p-type doping, in a first masked ion implantation step, in which the second device region 200 is masked by a first implantation mask (not shown) and the first stack of the first gate dielectric 40A, the first silicon portion 42A, and the first disposable germanium-containing portion 44A serves as an implantation mask. More than one masked ion implantation steps may be employed before and after formation of a first gate spacer 52 so that source and drain extension portions (not separately marked) abutting the first gate dielectric 40A and deep source and drain portions (not separately marked) abutting the buried insulator portions 20 may be formed for enhanced performance of an NMOSFET to be formed. One implanted portion of the first semiconductor portion 30A constitutes a first source region 36A, which has an n-type doping. Another implanted portion of the first semiconductor portion 30A constitutes a first drain portion 38A, which has an n-type doping. The dopant concentration of the first source portion 36A and the first drain portion 38A may be from about $1.0 \times 10^{19}/cm^3$ to about $1.0 \times 10^{21}/cm^3$, and preferably from about $1.0 \times 10^{20}/cm^3$ to about $5.0 \times 10^{20}/cm^3$, although lesser and greater dopant concentrations are explicitly contemplated herein. An unimplanted portion of the first semiconductor portion 30A between the first source region 36A and the first drain region 38A constitutes a first body region 34A having a p-type doping.

Likewise, p-type dopants are implanted into portions of the second semiconductor portion 30B, which has an n-type doping, in a second masked ion implantation step, in which the first device region 100 is masked by a second implantation mask (not shown) and the second stack of the second gate dielectric 40B, the second silicon portion 42B, and the second disposable germanium-containing portion 44B serves as an implantation mask. More than one masked ion implantation steps may be employed before and after formation of a second gate spacer 52' so that source and drain extension portions (not separately marked) abutting the second gate dielectric 40B and deep source and drain portions (not separately marked) abutting the buried insulator portions 20 may be formed for enhanced performance of a PMOSFET to be formed. One implanted portion of the second semiconductor portion 30B constitutes a second source region 36B, which has a p-type doping. Another implanted portion of the second semiconductor portion 30B constitutes a second drain portion 38B, which has a p-type doping. The dopant concentration of the second source portion 36B and the second drain portion 38B may be from about $1.0 \times 10^{19}/cm^3$ to about $1.0 \times 10^{21}/cm^3$, and preferably from about $1.0 \times 10^{20}/cm^3$ to about $5.0 \times 10^{20}/cm^3$, although lesser and greater dopant concentrations are explicitly contemplated herein. An unimplanted portion of the second semiconductor portion 30A between the second source region 36B and the second drain region 38B constitutes a second body region 34B having an n-type doping.

The first gate spacer 52 and the second gate spacer 52' are formed by a conformal deposition of a dielectric material layer (not shown) followed by an anisotropic etch. The first gate spacer 52 and the second gate spacer 52' typically comprise the same material, which may be silicon oxide, silicon oxynitride, silicon nitride, or a combination thereof. The lateral thickness of the first and second gate spacers (52, 52') as measured at the base abutting the semiconductor substrate 8 is determined by a desired offset between edges of the first or second gate dielectric (40A or 40B) and an edge of metal semiconductor alloy portions to be subsequently formed directly on the various source and drain regions (36A, 38A, 36B, or 38B). The first and second gate spacers (52, 52') are formed between a set of masked ion implantation steps employed to form various source and drain extension regions (not shown separately) and another set of masked ion implantation steps employed to form various deep source regions and deep drain regions (not shown separately) that may, or may not, contact a top surface of the buried dielectric layer 20.

The first gate spacer 52 extends above an interface between the first silicon portion 42A and the first disposable germanium-containing portion 44A. Similarly, the second gate spacer 52' extends above an interface between the second silicon portion 42B and the second disposable germanium-containing portion 44B. Thus, inner sidewalls of the first gate spacer 52 laterally abut the first disposable germanium-containing portion 44A and inner sidewalls of the second gate spacer 52' laterally abut the second disposable germanium-containing portion 44B. The first gate spacer 52 and the second gate spacer 52' may have substantially the same height, and may extend up to a top surface of the first or second disposable germanium-containing portion (44A or 44B).

Figure 4:
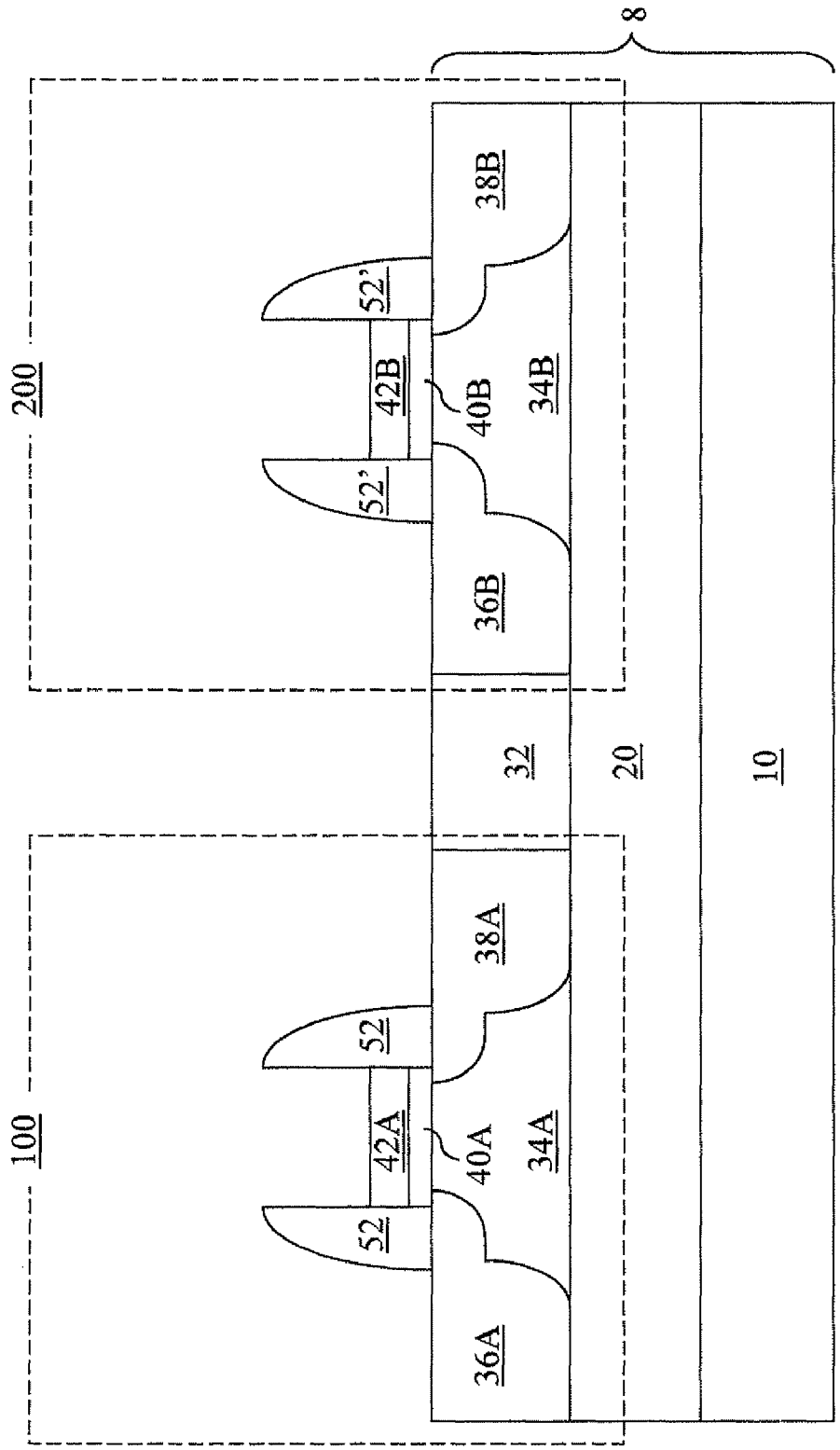

Referring to FIG. 4, the first and second disposable germanium-containing portions (44A, 44B) are removed selective to the first and second silicon portions (42A, 42B), the first and second gate spacers (52, 52'), the shallow trench isolation structure 32, and the various source and drain regions (36A, 38A, 36B, 38B) in the semiconductor substrate 8. A dry etch or a wet etch may be employed. The relatively high atomic concentration of germanium at about 25% or greater renders the first and second disposable germanium-containing portions (44A, 44B) etchable selective to the rest of exposed surfaces of the exemplary semiconductor structure that does not comprise germanium or has an atomic concentration of germanium less than 25%, and preferably less than 1%. An exemplary etch chemistry that may be employed for this chemistry is a mixture of $H_2O:H_2O_2:HF$ in the ratio of 40:1:1, which etches germanium containing materials selective to materials that do not contain germanium. Any other etch chemistry that removes germanium or germanium-containing compounds selective to compounds without germanium or a low concentration of germanium (typically less than 5%) may be employed. At the end of the selective etch, a top surface of the first silicon portion 42A and a top surface of the second silicon portion 42B are removed.

Figure 5:
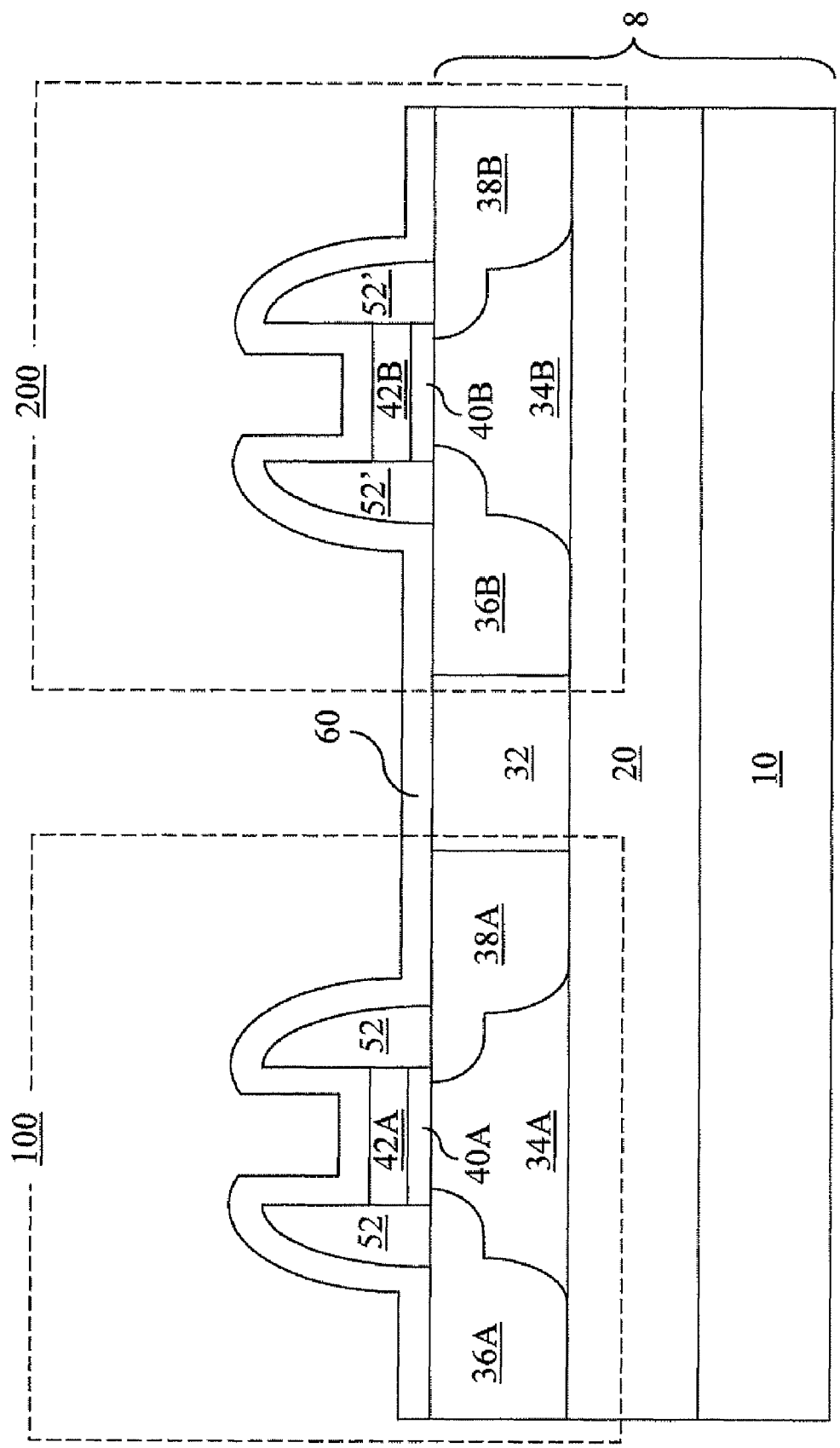

Referring to FIG. 5, a dielectric masking layer 60 is formed on the first and second silicon portions (42A, 42B), the first and second gate spacers (52, 52'), the shallow trench isolation structure 32, and the various source and drain regions (36A, 38A, 36B, 38B) in the semiconductor substrate 8. The dielectric masking layer 60 comprises a dielectric oxide or dielectric nitride. For example, the dielectric masking layer 60 may comprise silicon oxide. The dielectric masking layer 60 may be formed by plasma enhanced chemical vapor deposition (PECVD), low pressure chemical vapor deposition (LPCVD), rapid thermal chemical vapor deposition (RTCVD), high density plasma chemical vapor deposition (HDPCVD), or other known deposition techniques. Preferably, the deposition process employed for formation of the dielectric masking layer 60 is conformal. The thickness of the dielectric masking layer 60 may be from about 5 nm to about 100 nm, and preferably from about 10 nm 50 nm, although lesser and greater thicknesses are also contemplated herein.

An activation anneal is performed to activate the dopants that are now present in the first source and drain regions (36A, 38A) and the second source and drain regions (36B, 38B). The dopant atoms that may have occupied interstitial sites move into substitutional sites to "activate" the dopants, i.e., enable the dopant atoms to act as acceptor ions that contribute holes as charge carriers to a band structure, or as donor ions that contribute electrons as charge carriers. Also, any structural damage in the first source and drain regions (36A, 38A) and the second source and drain regions (36B, 38B) are healed during the activation anneal. The temperature and duration of the activation anneal is tailored to prevent any compositional damage to the first and second gate dielectrics (40A, 40B). Temperatures up to 1,150° C. may be employed for silicon oxide based gate dielectrics, while a lower temperature is employed for gate dielectrics comprising high-k gate dielectric materials. Typical anneal temperature for a gate electrode comprising a high-k gate dielectric material is from about 800° C. to about 1,050° C., and typically from about 850° C. to about 1,000° C.

Figure 6:
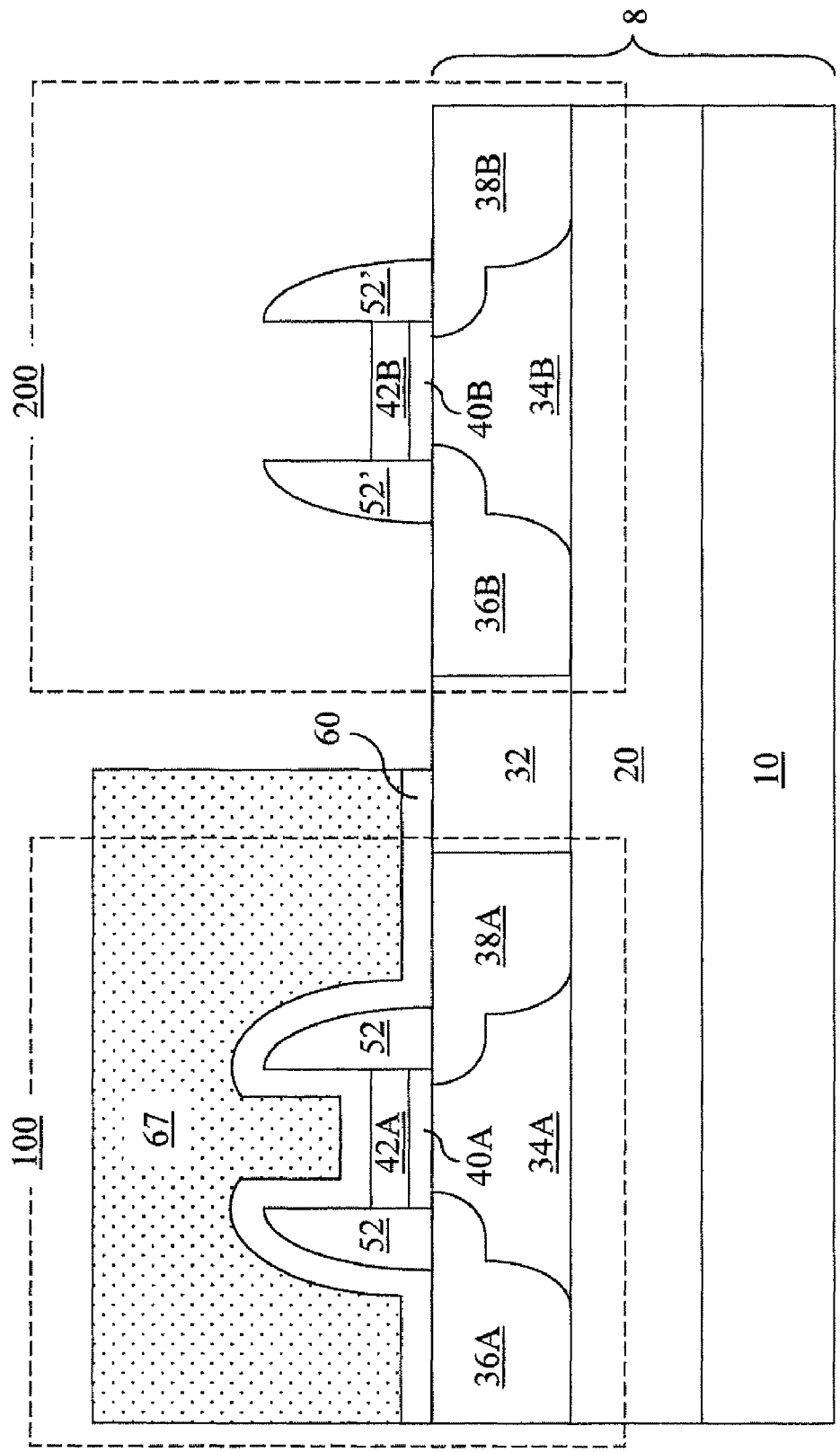

Referring to FIG. 6, a photoresist 67 is applied to the dielectric masking layer 60 and lithographically patterned to cover the first device region 100, while exposing the second device region 200. The exposed portions of the dielectric masking layer 60 is removed by an etch, which may be a dry etch or a wet etch. The etch may be an anisotropic etch or a substantially isotropic etch. Preferably, the etch is selective to the second silicon portion 42B. Preferably, the etch is also selective to the second source region 36B and the second drain region 38B. After exposing the second silicon portion 42B, the second source portion 36B, and the second drain portion 38B, the photoresist 67 may be removed, for example, by ashing. A suitable surface cleaning may be performed as needed.

Figure 7:
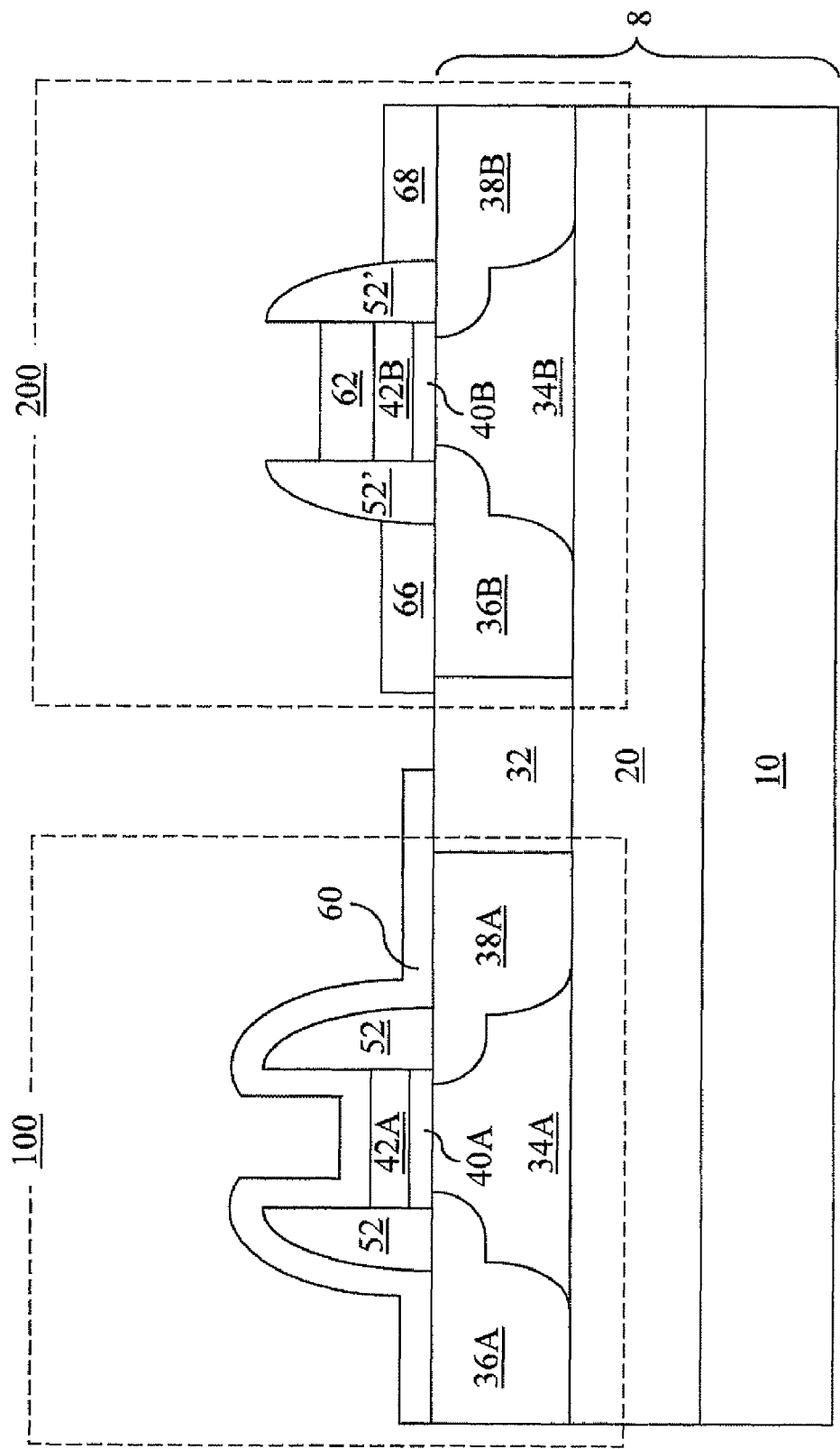

Referring to FIG. 7, germanium-containing portions are formed on exposed semiconductor surface by a deposition process that is selective to dielectric surfaces. At least one reactant which is a precursor for germanium deposition is flowed into a chemical vapor deposition (CVD) reactor with or without another reactant for another semiconductor material. For example, $GeH_4$, $Ge_2H_6$, or another germanium precursor gas may be provided into a CVD reactor without any other reactant for a semiconductor material to form germanium portions, which are germanium-containing portions having a germanium concentration of 100%. Alternately, $GeH_4$, $Ge_2H_6$, or another germanium precursor gas may be provided into a CVD reactor with another reactant for a semiconductor material such as $SiH_4$, $SiH_2Cl_2$, $SiHCl_3$, $SiCl_4$, $Si_2H_6$, etc. to form germanium-containing portions having a germanium concentration less than 100% and containing silicon or another semiconductor material.

Specifically, a gate side germanium-containing portion 62 is formed directly on the second silicon portion 42B, a source side germanium-containing portion 66 is formed directly on the second source region 36B, and a drain side germanium-containing portion 68 is formed directly on the second drain region. The gate side germanium-containing portion 62, the source side germanium-containing portion 66, and the drain side germanium-containing portion 68 comprise germanium or a silicon germanium alloy. Preferably, an atomic concentration of germanium in the gate side germanium-containing portion 62, the source side germanium-containing portion 66, and the drain side germanium-containing portion 68 is from about 5% to 100%, preferably from about 25% to 100%, and more preferably from about 50% to 100%. The atomic concentration of germanium may be substantially uniform throughout, and across, the gate side germanium-containing portion 62, the source side germanium-containing portion 66, and the drain side germanium-containing portion 68 as deposited.

The deposition process for the various germanium-containing portions (62, 66, 68) is a selective deposition process so that germanium or a germanium-containing alloy, such as a silicon germanium alloy, is deposited on semiconductor surfaces, and is not deposited on dielectric surfaces during the selective germanium-containing material deposition process. Specifically, no germanium-containing material is deposited on the dielectric masking layer 60, the shallow trench isolation structure 20, or the second gate spacer 52'. Since the dielectric masking layer 60 covers the first silicon portion 42A, the first source region 36A, and the first drain region 38A, deposition of a germanium containing material, i.e., germanium or a germanium-containing alloy, does not occur on these surfaces.

Typically, there is a significant lattice mismatch between the second source region 36B and the source side germanium-containing portion 66, and between the second drain region 38B and the drain side germanium-containing portion 68, especially if the second source region 36b and the second drain region 38B comprise silicon, since the concentration of germanium within the source side germanium-containing portion 66 and the drain side germanium-containing portion 68 is about 5% or greater. Thus, all of the gate side germanium-containing portion 62, the source side germanium-containing portion 66, and the drain side germanium-containing portion 68 are formed as amorphous or polycrystalline, i.e., there is no epitaxial alignment between between the second source region 36B and the source side germanium-containing portion 66 or between the second drain region 38B and the drain side germanium-containing portion 68.

Each of the gate side germanium-containing portion 62, the source side germanium-containing portion 66, and the drain side germanium-containing portion 68 has a thickness from about 1 nm to 90 nm. The thickness of the source side germanium-containing portion 66 and the thickness of the drain side germanium-containing portion 68 are substantially the same since the second source region 36B and the second drain region 38B have substantially the same dopant concentration. Depending on the nature of the deposition process, the thickness of the gate side germanium-containing portion 62 may be substantially the same as, or may be different from, the thickness of the source side germanium-containing portion 66.

Figure 8:
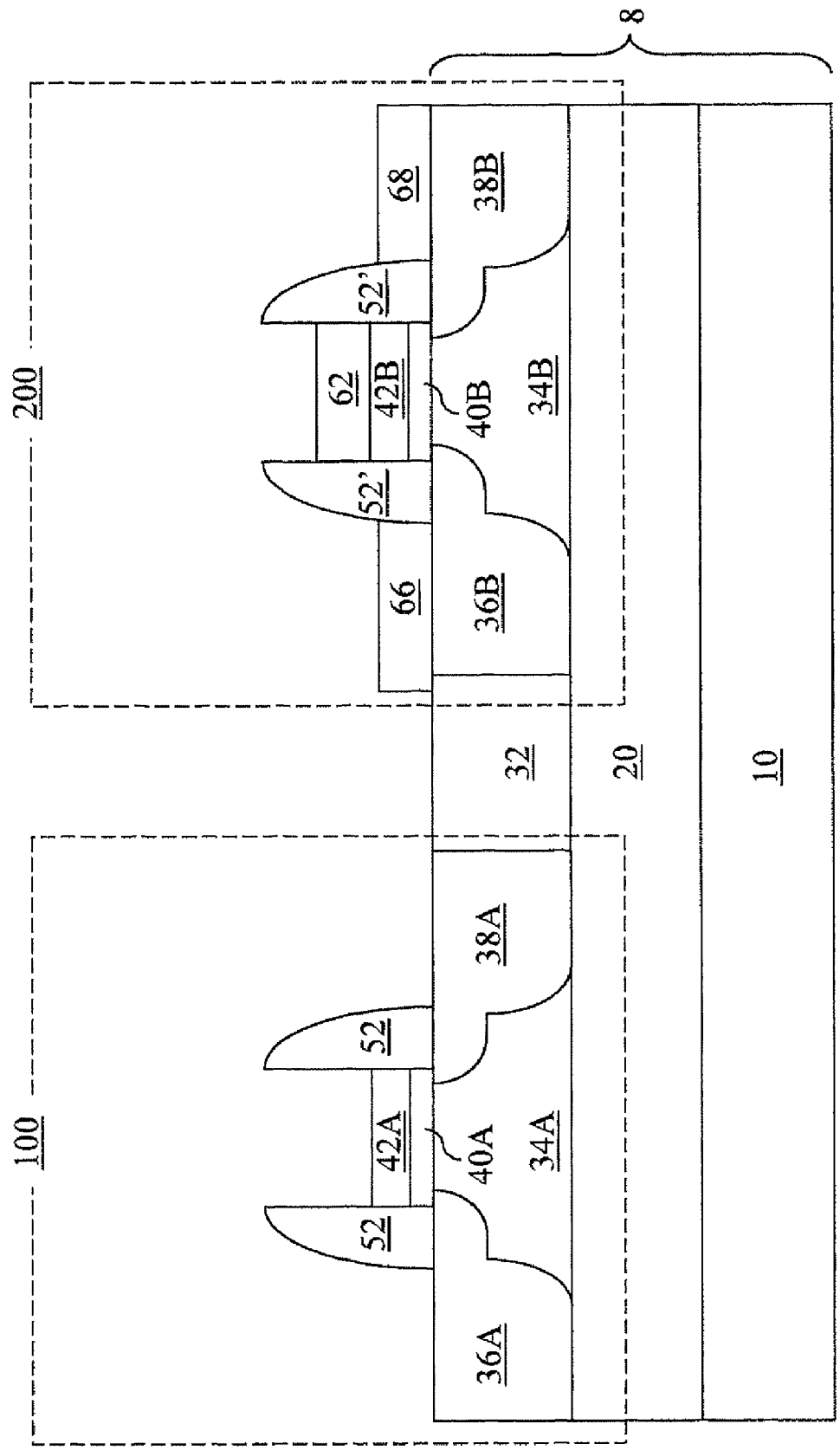

Referring to FIG. 8, the dielectric masking layer 60 is removed selective to the gate side germanium-containing portion 62, the source side germanium-containing portion 66, the drain side geranium-containing portion 68, the first source and drain regions (36A, 38A), the first silicon portion 42A, and the first and second gate spacers (52, 52') by an etch, which may be a wet etch or a dry etch. The etch may be anisotropic, or preferably, substantially isotropic. For example, if the dielectric masking layer 60 comprises silicon oxide, the etch may be a wet etch employing hydrofluoric acid (HF).

Figure 9:
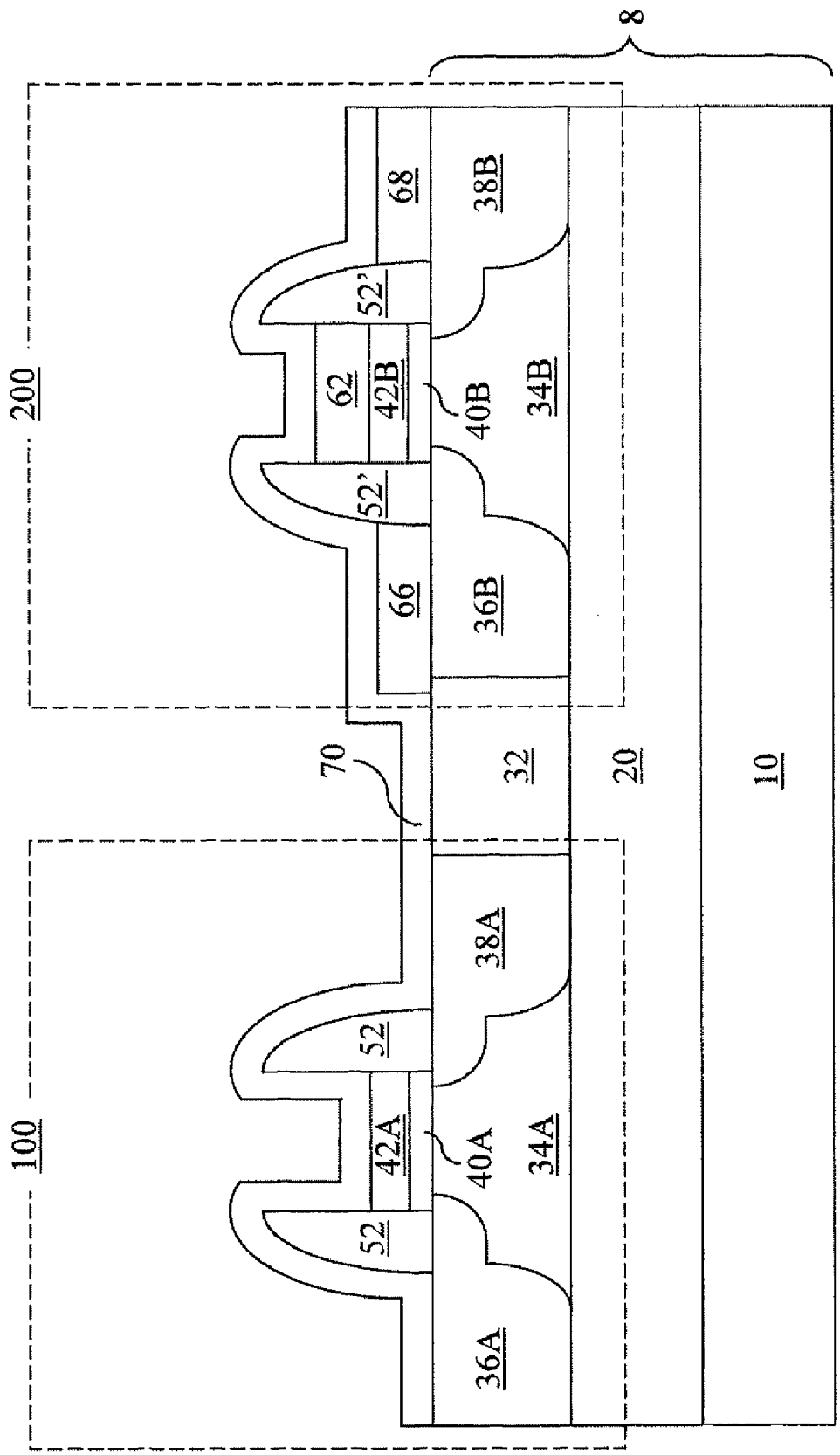

Referring to FIG. 9, a metal layer 70 is deposited on exposed surfaces on the top side of the exemplary semiconductor structure. The metal layer 70 is typically contiguous over the entirety of the semiconductor substrate 8. The metal layer 70 directly contacts the first silicon portion 42A, the first source and drain regions (36A, 38A), the gate side germanium-containing portion 62, and the second source and drain regions (36B, 38B). A step is formed in the metal layer 70 at an edge of the source side germanium-containing portion 66 and at another edge (not shown) of the drain side germanium-containing portion 68.

Preferably, the metal layer 70 comprises a metal that forms a metal monosilicide and a metal monogermanide. Non-limiting exemplary materials for the metal layer 70 include nickel, platinum, palladium, cobalt or a combination thereof. The formation of the metal layer 70 may be effected by physical vapor deposition (PVD), chemical vapor deposition (CVD), or atomic layer deposition (ALD). The metal layer 70 may be deposited in a conformal or non-conformal manner. Preferably, the metal deposition is substantially conformal.

The various semiconductor portions in direct contact with the metal layer 70 are metallized by reacting with the metal in the metal layer 70 during a metallization anneal. The metallization is effected by an anneal at a temperature from about 350° C. to about 550° C., which is typically performed in an non-oxygen containing gas atmosphere, e.g., He, Ar, $N_2$, or forming gas. Preferably, the anneal is performed at a temperature from about 400° C. to about 500° C. A continuous heating at a constant temperature or various ramping in temperature may be employed. The anneal may be performed for a time period from about 1 second to about 60 seconds, and preferably, from about 1 second to about 30 seconds. The metallization may further be effected by an additional anneal at a temperature from about 400° C. to about 750° C. Preferably, the additional anneal is performed at a temperature from about 500° C. to about 700° C. One advantage of a multi-stage anneal process that employs multiple anneals at different temperatures is formation of metal monosilicide phases and metal monogermanide phases that have lower resistivity than other phases of the metal silicide or metal germanide. After the metallization process, unreacted portions of the metal layer 70, which are present over dielectric surfaces such as the first and gate spacers (52, 52') and the shallow trench isolation structure 32, are removed selective to various metal semiconductor alloy portions by an etch, which may be a wet etch. A typical etchant for such a wet etch employs aqua regia.

Figure 10:
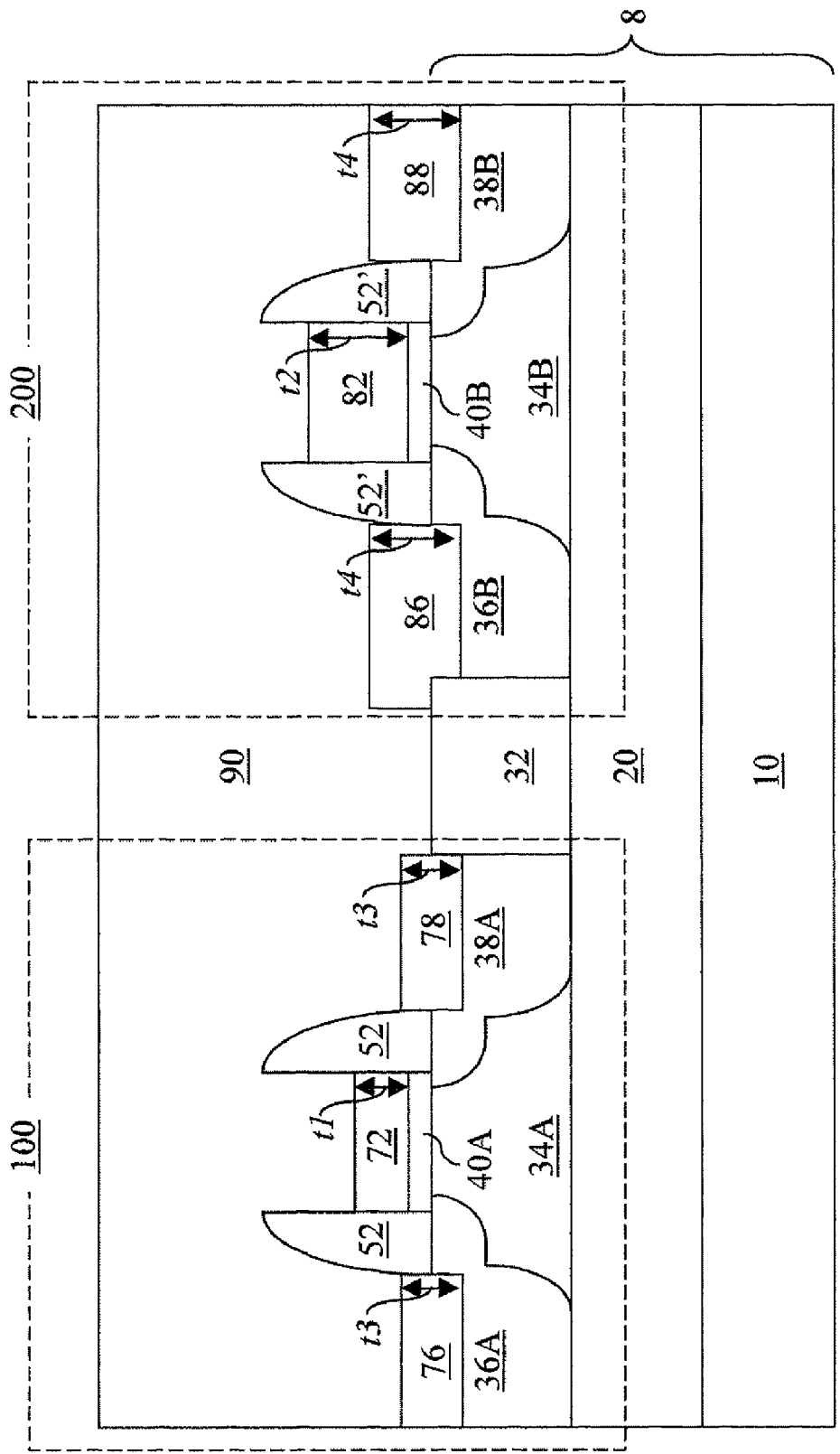

Referring to FIG. 10, the various metal semiconductor alloy portions that are formed by the metallization process are shown, which include a first gate electrode 72, a second gate electrode 82, a source side metal silicide portion 76, a drain side metal silicide portion 78, a source side metal silicide-germanide alloy portion 86, and a drain side metal silicide-germanide alloy portion 88. The first gate electrode 72 is formed by fill silicidation of the first silicon portion 42A by the metal layer 70, i.e., the metallization process reaches the material of the first silicon portion 42A at the interface between the first silicon portion 42A and the first gate dielectric 40A. The first gate electrode 72 thus comprises a metal silicide, and preferably a metal monosilicide at the gate dielectric interface, i.e., the interface with the first gate dielectric 40A. The thickness of the first gate electrode 72 is herein referred to as a first thickness t1. The second gate electrode 72 is formed by full metallization of the gate side germanium-containing portion 62 and the second silicon portion 42B by the metal layer 70, i.e., the metallization process proceeds past the bottom surface of the gate side germanium-containing portion 62 and reaches the material of the second silicon portion 42B at the interface between the second silicon portion 42B and the second gate dielectric 40B. The second gate electrode 62 preferably comprises an alloy of a metal monosilicide and a metal monogermanide at the gate dielectric interface, i.e., the interface with the second gate dielectric 40B. The thickness of the second gate electrode 62 is herein referred to as a second thickness t2. The second thickness t2 is greater than the first thickness due to the additional semiconductor material provided by the gate side germanium-containing portion 62 in the second device region 200 that is metallized.

The source side metal silicide portion 76 is formed directly on the first source region 36A of an n-type metal-oxide-semiconductor field effect transistor (NMOSFET) and comprises a metal silicide. The drain side metal silicide portion 78 is formed directly on the first drain region 36B of the n-type metal-oxide-semiconductor field effect transistor and comprises a metal silicide. The source side metal silicide portion 76 and the drain side metal silicide portion 78 have the same thickness, which is herein referred to as a third thickness t3.

The source side metal silicide-germanide alloy portion 86 is formed directly on the second source region 36B of a p-type metal-oxide-semiconductor field effect transistor (PMOSFET) and comprises a metal silicide-germanide alloy. The drain side metal silicide-germanide alloy portion 88 is formed directly on the second drain region 38B of the p-type metal-oxide-semiconductor field effect transistor and comprises a metal silicide-germanide alloy. The source side metal silicide-germanide alloy portion 86 and the drain side metal silicide-germanide alloy portion 88 have the same thickness, which is herein referred to as a fourth thickness t4. The fourth thickness t4 is greater than the third thickness t3 since the source side germanium-containing portion 66 and the drain side germanium-containing portion 68 provide an additional material for metallization which is more easily metallized than silicon.

Preferably, the first gate electrode 72 has a composition of MSi at the interface with the first gate dielectric 40A, and the second gate electrode 82 has a composition of $MGe_xSi_{1-x}$ at the interface with the second gate dielectric 40B, in which x is from about 0.05 to about 0.85. M is an elemental metal or a metal alloy having a composition of $A_yB_{1-y}$, in which y is from 0 to 1, and A is a first elemental metal and B is a second elemental metal. Typically, a gate electrode material having a work function near a valence band gap edge is preferred for enhanced performance of the PMOSFET. In this case, x is preferably from about 0.25 to about 0.85, and more preferably from about 0.50 to about 0.85. The upper limit of about 0.85 is placed due to a finite thickness of the second silicon portion 40B.

The ratio of the second thickness t2 to the first thickness t1 is from 1.0 to about 1.30, and preferably from about 1.1 to about 1.30. The second gate electrode 82 may have a vertically graded composition, in which the value of x increases with distance from the second gate dielectric 40B. This occurs when there is insufficient intermixing of a metal silicide and a metal germanide within in the second gate electrode 82 due to limited thermal treatment during the metallization anneal(s). Alternately, the value of x may be substantially constant throughout the second gate electrode 82, which occurs when there is a sufficient intermixing of the metal silicide and the metal germanide within the second gate electrode 82 to homogenize the second gate electrode 82 due to sufficient thermal treatment during the metallization anneal(s).

Prior to metallization, i.e., prior to formation of the first gate electrode 72 and the second gate electrode 82, the thickness of the first silicon portion 42A and the second silicon portion 42B are necessarily the same. In case the gate side germanium-containing portion 62 is germanium or another semiconductor alloy that does not comprise silicon, the second silicon portion 42B is the only source for silicon for the second gate electrode 82. Since the thickness of the first silicon portion 42A and the second silicon portion 42B are the same and the gate side germanium-containing portion 62 does not contain any silicon, the amount of silicon per unit area is the same between the first silicon portion 42A and the combined stack of the second silicon portion 42B and the germanium-containing portion 62 prior to the metallization anneal(s). The first gate electrode 72 and the second gate electrode 82, which are formed after the metallization anneal, have the same total amount of silicon per unit area, i.e., the total amount of silicon per unit area within the first gate electrode 72 is substantially the same as the total amount of silicon per unit area within the second gate electrode 82. Since the second thickness t2 is greater than the first thickness t1, the amount of silicon per unit volume for the first gate electrode 72 is greater than the amount of silicon per unit volume for the second gate electrode 82. If the first gate electrode 72 and the second gate electrode 82 are homogeneous, respectively, the ratio of the amount of silicon per unit volume for the first gate electrode 72 to the amount of silicon per unit volume for the second gate electrode 82 is the same as the ratio of the second thickness t2 to the first thickness t1.

A middle-of-line (MOL) dielectric layer 90, which may, or may not, include a reactive ion eth (RIE) barrier layer (not shown), is deposited over the first gate electrode 72, the second gate electrode 82, the first and second gate spacers (52, 52'), the shallow trench isolation structure 20, the source side metal silicide portion 76, the drain side metal silicide portion 78, the source side metal silicide-germanide alloy portion 86, and the drain side metal silicide-germanide alloy portion 88. The MOL dielectric layer 90 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Alternately, the MOL dielectric layer 90 may comprise a low-k dielectric material having a dielectric constant less than 3.9 (the dielectric constant of silicon oxide), and preferably less than about 2.5. Exemplary low-k dielectric materials include organosilicate glass (OSG) and SiLK™. The MOL dielectric layer 90 vertically abuts a top surface of the first gate electrode 72, a top surface of the second gate electrode 82, inner sidewalls of the first gate spacer 52, and inner sidewalls of the second gate spacer 52'.

Typically, various contact via holes (not shown) are formed in the MOL dielectric layer 90 and filled with metal to from various contact vias (not shown). A first level metal wiring (not shown) is thereafter formed followed by further formation of additional back-end-of-line (BEOL) structures (not shown).

Thus, the exemplary semiconductor structure comprises:

an n-type metal-oxide-semiconductor field effect transistor having a first gate dielectric 40A and a first gate electrode 72 located directly on the first gate dielectric 40A, wherein the first gate electrode 72 comprise a metal silicide and has a first thickness t1; and a p-type metal-oxide-semiconductor field effect transistor having a second gate dielectric 40B and a second gate electrode 82 located directly on the second gate dielectric 40B, wherein the second gate electrode 82 comprises a metal silicide-germanide alloy and has a second thickness t2, wherein the second thickness t2 is greater than the first thickness t1.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a first gate dielectric on a first semiconductor portion of a semiconductor substrate and a second gate dielectric on a second semiconductor portion of said semiconductor substrate;
   forming a first silicon portion on said first gate dielectric and a second silicon portion of said second gate dielectric;
   forming a dielectric masking layer on said first silicon portion;
   forming a gate side germanium-containing portion on said second silicon portion, while said dielectric masking layer covers said first silicon portion and prevents formation of any germanium on said first silicon portion during said formation of said gate side germanium-containing portion; and
   forming a first gate electrode comprising a metal silicide directly on said first gate dielectric and forming a second gate electrode comprising a metal silicide-germanide alloy directly on said second gate dielectric.

2. The method of claim 1, further comprising forming a first disposable germanium-containing portion on said first silicon portion and a second disposable germanium-containing portion on said second silicon portion prior to said forming of said gate side germanium-containing portion, wherein said first and second germanium-containing portions comprise germanium at an atomic concentration from about 25% to 100%.

3. The method of claim 2, wherein said first and second disposable germanium-containing portions comprise germanium or a silicon germanium alloy having a same germanium concentration.

4. The method of claim 2, further comprising forming a first gate spacer on sidewalls of said first silicon portion and said first disposable germanium-containing portion and a second gate spacer on sidewalls of said second silicon port ion and said second disposable germanium-containing portion.

5. The method of claim 1, further comprising:
   forming a gate dielectric layer directly on said semiconductor substrate;
   forming a silicon layer comprising amorphous silicon or polysilicon directly on said gate dielectric layer;
   forming a germanium-containing layer comprising germanium at an atomic concentration of about 25% or greater directly on said silicon layer; and
   patterning said germanium-containing layer and, said silicon layer, wherein said first silicon portion and said second silicon portion are formed from said silicon layer, and wherein a first disposable germanium-containing portion is formed on said first silicon portion and a second disposable germanium-containing portion is formed on said second silicon portion.

6. A method of forming a semiconductor structure comprising:
   forming a first gate dielectric on a first semiconductor portion of a semiconductor substrate and a second gate dielectric on a second semiconductor portion of said semiconductor substrate;
   forming a first silicon portion on said first gate dielectric and a second silicon portion of said second gate dielectric;
   forming a first disposable germanium-containing portion on said first silicon portion and a second disposable germanium-containing portion on said second silicon;
   removing said first and second disposable germanium-containing portions selective to said first and second silicon portions;
   forming a gate side germanium-containing portion on said second silicon portion, while no germanium is deposited on said first silicon portion; and
   forming a first gate electrode comprising a metal silicide directly on said first gate dielectric and forming a second gate electrode comprising a metal silicide-germanide alloy directly on said second gate dielectric.

7. The method of claim 6, further comprising forming a dielectric masking layer directly on said first and second silicon portions after said removing of said first and second disposable germanium-containing portions.

8. The method of claim 7, further comprising patterning said dielectric masking layer, wherein said first silicon portion is covered by said dielectric masking layer after said patterning, and wherein said second silicon portion is exposed after said patterning.

9. The method of claim 8, wherein said gate side germanium-containing portion comprises germanium or a silicon germanium alloy.

10. The method of claim 9, wherein a selective germanium-containing material deposition process is employed to form said gate side germanium-containing portion, wherein germanium or said silicon germanium alloy is deposited on semiconductor surfaces and is not deposited on dielectric surfaces during said selective germanium-containing material deposition process.

11. The method of claim 9, further comprising:
    depositing a metal layer directly on said first silicon portion and said gate side germanium-containing portion; and
    metallizing said first silicon portion and a stack of said gate side germanium-containing portion and said second silicon portion.

12. The method of claim 11, wherein said metallizing is effected by an anneal at a temperature from about 350° C. to about 550° C.

13. The method of claim 11, wherein a first gate electrode comprising a metal silicide is formed directly on said first gate electrode and a second gate electrode comprising a metal silicide-germanide alloy is formed directly on said second gate electrode.

14. The method of claim 13, wherein said first gate electrode has a composition of MSi at an interface with said first gate dielectric and said second gate electrode has a composition of $MGe_xSi_{1-x}$ at an interface with said second gate dielectric, wherein x is from about 0.05 to about 0.85, and M is an elemental metal or a metal alloy having a composition of $A_yB_{1-y}$, wherein y is from 0 to 1, and A is a first elemental metal and B is a second elemental metal.

15. The method of claim 8, further comprising:
    forming a first gate spacer on said first silicon portion and a second gate spacer on said second silicon portion; and
    forming a first source region and a first drain region in said first semiconductor portion and a second source region and a second drain region in said second semiconductor portion.

16. The method of claim 15, wherein said first source region and said first drain region are covered by said dielectric masking layer after said patterning, and wherein said second source region and said second drain region are exposed after said patterning.

17. The method of claim 16, further comprising:
    forming a gate side germanium-containing portion directly on said second silicon portion;

forming a source side germanium-containing portion directly on said second source region; and forming a drain side germanium-containing portion directly on said second drain region, wherein deposition of germanium or a germanium-containing alloy does not occur directly on said first silicon portion, said first source region, and said first drain region.

18. The method of claim 6, wherein said first disposable germanium-containing portion and said second disposable germanium-containing portion are formed prior to said forming of said gate side germanium-containing portion, wherein said first and second germanium-containing portions comprise germanium at an atomic concentration from about 25% to 100%.

19. A semiconductor structure comprising:
a first field effect transistor having a first gate dielectric and a first gate electrode located directly on said first gate dielectric, wherein said first gate electrode comprises a metal silicide and has a first thickness; and
a second field effect transistor having a second gate dielectric and a second gate electrode located directly on said second gate dielectric, wherein said second gate electrode comprises a metal silicide-germanide alloy and has a second thickness, wherein said second thickness is greater than said first thickness, and wherein a total amount of silicon per unit area within said first gate electrode is substantially the same as a total amount of silicon per unit area within said second gate electrode.

20. The semiconductor structure of claim 19, further comprising:
a source side metal silicide portion located directly on a source region of said first field effect transistor and comprising said metal silicide and having a third thickness;
a drain side metal silicide portion located directly on a drain region of said first field effect transistor and comprising said metal silicide and having said third thickness;
a source side metal silicide-germanide alloy portion located directly on a source region of said second field effect transistor and comprising said metal silicide-germanide alloy and having a fourth thickness; and
a drain side metal silicide-germanide alloy portion located directly on a drain region of said second field effect transistor and comprising said metal silicide-germanide alloy and having said fourth thickness, wherein said fourth thickness is greater than said third thickness.

21. The semiconductor structure of claim 20, wherein said metal silicide and said metal silicide-germanide alloy are derived from a metal that forms a metal monosilicide and a metal monogermanide.

22. The semiconductor structure of claim 20, wherein a ratio of said second thickness to said first thickness is from 1.0 to about 1.30.

23. The semiconductor structure of claim 19, further comprising:
a first gate spacer laterally abutting said first gate electrode;
a second gate spacer laterally abutting said second gate electrode;
a middle-of-the-line (MOL) dielectric layer vertically abutting a top surface of said first gate electrode, a top surface of said second gate electrode, inner sidewalls of said first gate spacer, and inner sidewalls of said second gate spacer.

24. The semiconductor structure of claim 19, wherein said first gate electrode has a composition of MSi at an interface with said first gate dielectric, and said second gate electrode has a composition of $MGe_xSi_{1-x}$ at an interface with said second gate dielectric, wherein x is from about 0.05 to about 0.85, and M is an elemental metal or a metal alloy having a composition of $A_yB_{1-y}$, wherein y is from 0 to 1, and A is a first elemental metal and B is a second elemental metal.

25. The semiconductor structure of claim 19, wherein said first field effect transistor is an n-type field effect transistor and said second field effect transistor is a p-type field effect transistor.

* * * * *